United States Patent
Hiroi et al.

(10) Patent No.: US 8,134,226 B2
(45) Date of Patent: Mar. 13, 2012

(54) PROCESSING APPARATUS WITH MEMORIES COUPLED TO RESPECTIVE PROCESSORS

(75) Inventors: Toshiyuki Hiroi, Saitama (JP); Akihiko Sugawara, Kanagawa (JP)

(73) Assignee: Sony Computer Entertainment Inc., Tokyo (JP)

( * ) Notice: Subject to any disclaimer, the term of this patent is extended or adjusted under 35 U.S.C. 154(b) by 393 days.

(21) Appl. No.: 11/728,542

(22) Filed: Mar. 26, 2007

(65) Prior Publication Data

US 2007/0240083 A1 Oct. 11, 2007

(30) Foreign Application Priority Data

Mar. 28, 2006 (JP) .................................. 2006-089104

(51) Int. Cl.
*H01L 23/02* (2006.01)
(52) U.S. Cl. ....................................................... 257/678
(58) Field of Classification Search .................. 257/685, 257/686
See application file for complete search history.

(56) References Cited

U.S. PATENT DOCUMENTS

| | | | |
|---|---|---|---|
| 6,051,878 A * | 4/2000 | Akram et al. ................. | 257/686 |
| 6,567,426 B1 | 5/2003 | van Hook et al. | |
| 6,836,815 B1 * | 12/2004 | Purcell et al. ................. | 710/317 |
| 2002/0099855 A1 * | 7/2002 | Bass et al. ..................... | 709/249 |
| 2003/0115500 A1 * | 6/2003 | Akrout et al. .................. | 714/10 |

FOREIGN PATENT DOCUMENTS

| | | |
|---|---|---|
| EP | 1 610 383 | 12/2005 |
| JP | 8 504060 | 4/1996 |
| JP | 2002 506251 | 2/2002 |
| JP | 2003 282813 | 10/2003 |
| JP | 2005 25599 | 1/2005 |
| JP | 2005 217205 | 8/2005 |
| WO | WO 2005 078797 | 8/2005 |

* cited by examiner

*Primary Examiner* — Scott B Geyer
(74) *Attorney, Agent, or Firm* — Frommer Lawrence & Haug LLP; William S. Frommer; Paul A. Levy

(57) ABSTRACT

In a processing apparatus, a plurality of processors which perform different kinds of processing is integrated on a first semiconductor substrate. A plurality of memories to be managed by the plurality of processors integrated on the first semiconductor substrate is integrated on a second semiconductor substrate. The plurality of processors integrated on the first semiconductor substrate includes respective separate memory controllers which control the memories to be managed that are integrated on the second semiconductor substrate. The semiconductor substrates are manufactured using different semiconductor manufacturing processes, and micro bumps are formed on their respective surfaces. The semiconductor substrates are stacked together in the thickness direction, and are connected to each other through the micro bumps.

5 Claims, 3 Drawing Sheets

PROCESSING APPARATUS WITH MEMORIES COUPLED TO RESPECTIVE PROCESSORS

BACKGROUND OF THE INVENTION

1. Field of the Invention

The present invention relates to a processing apparatus, and in particular, to a processing apparatus which has processors for performing a plurality of different kinds of processing.

2. Description of the Related Art

Personal computers, workstations, and high-performance game consoles have been advancing in functionality and performance in recent years. Arithmetic processing apparatuses to be used therein have therefore been increasing in circuit scale. These arithmetic processing apparatuses typically comprise a CPU (Central Processing Unit) or other processors which perform general-purpose arithmetic processing, a processor which manages signal input and output, a processor which performs audio signal processing, and a graphics processor which performs image processing, as well as memories to be used and managed by the processors.

Under the circumstances, it has been a significant challenge to achieve cost reduction while integrating the processors and the memories needed to satisfy performance requirements. An embedded dynamic random access memory (eDRAM) is sometimes used in order to merge and integrate one processor and a memory to be managed by the processor into a single semiconductor substrate. The use of eDRAMs makes it possible to enjoy advantages such that there is no need for input and output buffers or wiring on printed circuit boards since the processors and the memories are formed on the same semiconductor substrate, and that broad bandwidth design becomes feasible.

Nevertheless, in recent arithmetic processing apparatuses, the processors that require high speed and high functionality, such as CPUs and graphics processors, have often been designed and manufactured using the most advanced processes of such as 0.13 μm, 0.11 μm, 90 nm, and the like in order to suppress a rise in chip area and power consumption ascribable to increased circuit scales. When the most advanced processes are used, the incorporation of DRAMs, which do not require integration to a level as high as the processors, can result in increased cost. In such situations, the eDRAM-based design is not necessarily optimal.

There has recently been a technology developed in which terminals called micro bumps, having diameters of several tens of micrometers, are arranged for the purpose of signal input and output and for power supply. The introduction of such a structure enables of the application of CoC (Chip on Chip) and SIS (System In Silicon) configurations. In a CoC configuration, a semiconductor chip is stacked on another semiconductor chip, and they are connected through micro bumps. In an SIS configuration, a plurality of silicon chips are arranged on a substrate called a silicon interposer and the silicon chips are connected to each other through the micro bumps and the silicon interposer. The CoC and SIS configurations using micro bumps make high-speed data transfer between chips possible.

Under the circumstances, for arithmetic processing apparatuses that incorporate a high-performance graphics processor and the like for handling three-dimensional graphics, it is a significant challenge to optimize the balance between performance and cost with respect to how to integrate a CPU which performs general-purpose arithmetic processing and application-specific processors which are dedicated and designed for specific processing such as graphics and input and output signal processing.

SUMMARY OF THE INVENTION

The present invention has been developed in view of the foregoing challenges, and a general purpose thereof is to provide a processing apparatus which has processing power that is well balanced with cost.

A processing apparatus according to one embodiment of the present invention includes: a first semiconductor substrate on which a plurality of processors for performing different processing is integrated; and a second semiconductor substrate on which a plurality of memories to be respectively managed by the plurality of processors integrated on the first semiconductor substrate is integrated. The plurality of processors integrated on the first semiconductor substrate includes respective separate memory controllers for controlling the memories to be managed that are integrated on the second semiconductor substrate.

According to this embodiment, the plurality of processors is provided with respective memory controllers and memories individually, instead of a single memory being shared among the processors. This makes it possible to apply memory management that is optimal for each individual processor. Moreover, since the plurality of processors and the plurality of memories are integrated on separate semiconductor substrates, it is possible to select an optimal process for forming processors, or logic, and an optimal process for forming memories such as a DRAM.

The first and second semiconductor substrates may be formed using different semiconductor manufacturing processes, and micro bumps may be formed on their respective surfaces. The first and second semiconductor substrates may be stacked together in the thickness direction, and connected to each other through the micro bumps. The plurality of processors and the respective plurality of memories to be managed may be arranged so that their projections at least partially overlap each other.

In this embodiment, the plurality of processors and the respective plurality of memories are individually connected to each other. The micro-bump connection makes it possible to design in bit width without limitations, and can reduce the area occupied by a semiconductor chip.

Another embodiment of the present invention also relates to a processing apparatus. The processing apparatus according to this embodiment includes: an arithmetic processor which performs general-purpose processing; a memory to be managed by the arithmetic processor; a plurality of application-specific processors which are designed to perform specific processing; and application-specific memories to be managed by the plurality of application-specific processors. The arithmetic processor and the application-specific processors excluding an image processor for performing image processing are integrated on a first semiconductor substrate. The memory to be managed by the arithmetic processor and the application-specific memories to be managed by the application-specific processors excluding the image processor are integrated on a second semiconductor substrate.

According to this embodiment, a bus between the arithmetic processor and the application-specific processors that are integrated on the first semiconductor substrate can be built into the semiconductor substrate. This makes stable signal processing possible. The image processor and the memory to be managed by the image processor often have to be connected to each other with a broad bandwidth. Therefore, the image processor and the memory may be designed as separate chips outside the first and second semiconductor substrates. This allows for a throughput-oriented design.

The image processor of the plurality of application-specific processors and the memory to be managed by the image processor of the application-specific memories may be integrated on a third semiconductor substrate. When the memory to be managed by the image processor is designed as an eDRAM, it is possible to ensure a broad bandwidth.

The first and second semiconductor substrates may be manufactured using different semiconductor manufacturing processes, respectively. In this instance, the manufacturing process rule of the first semiconductor substrate may be finer than the manufacturing process rule of the second semiconductor substrate. Furthermore, the manufacturing process rule of the first semiconductor substrate may be the finest process available at the time of designing.

According to this embodiment, a manufacturing process optimal for designing processors, i.e., designing logic circuits can be selected as the manufacturing process of the first semiconductor substrate, and a manufacturing process optimal for designing memory arrays can be selected as the manufacturing process of the second semiconductor substrate. This can guarantee the effect of improved yield, reduced area of occupation, and any associated cost reduction.

Yet another embodiment of the present invention relates to a processing apparatus which includes a plurality of processors and a plurality of memories to be managed by the plurality of processors. In the processing apparatus of this embodiment, the plurality of processors and the plurality of memories are classified depending on respective semiconductor manufacturing processes optimal for manufacturing these. Processors and memories classified for an identical semiconductor manufacturing process are therefore formed on the same semiconductor substrate.

According to this embodiment, the processors and the memories are classified by optimal manufacturing processes in consideration of throughput, cost, power consumption, and the like required of the respective components. This makes it possible to optimize the design of the entire processing apparatus.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
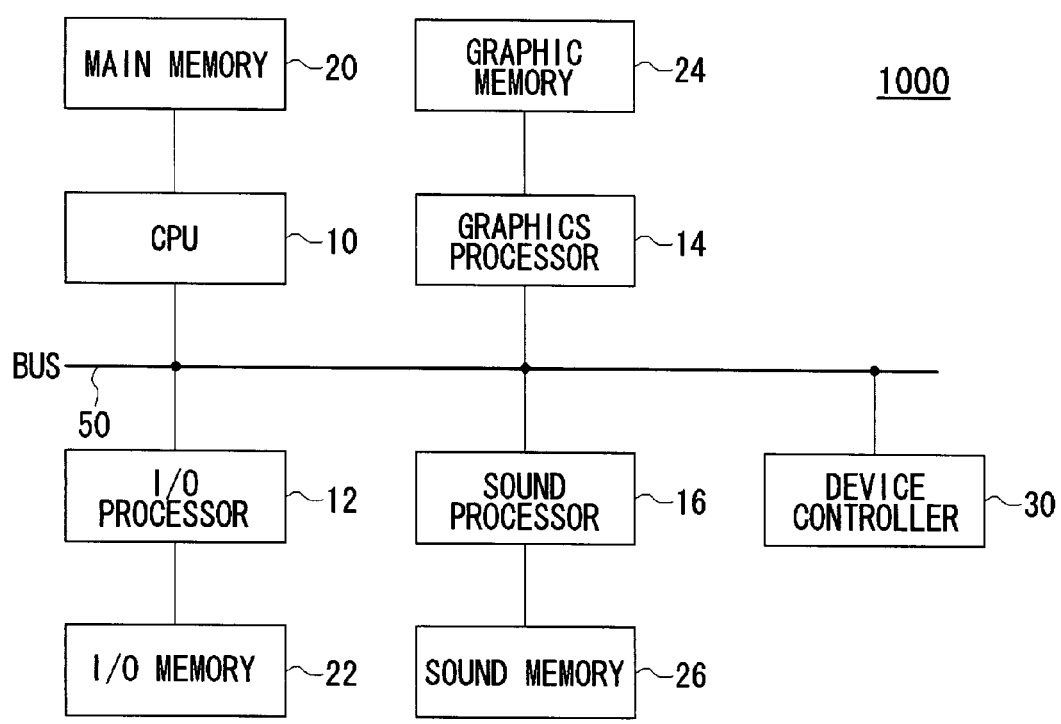
FIG. 1 is a block diagram showing the configuration of an arithmetic processing apparatus according to an embodiment.

The invention will now be described based on preferred embodiments which do not intend to limit the scope of the present invention but exemplify the invention. All of the features and the combinations thereof described in the embodiment are not necessarily essential to the invention.

Hereinafter, arithmetic processing apparatuses according to an embodiment of the present invention will be described with reference to the drawings. The same or equivalent components, members, and processes shown in the diagrams will be designated with like reference numerals. Overlapping description will be omitted as appropriate.

FIG. 1 is a block diagram showing the configuration of an arithmetic processing apparatus 1000 according to the embodiment. This arithmetic processing apparatus 1000 is mounted on a personal computer, workstation, game console, or the like. It executes various kinds of arithmetic processing and stores the results in a memory, a hard disk, other recording media, or the like, or outputs the results to a monitor. By way of example, the present embodiment will deal with the case where the arithmetic processing apparatus 1000 is a game console.

The arithmetic processing apparatus 1000 includes a plurality of processors which perform different kinds of processing. For example, the plurality of processors includes a main processor, or CPU 10, and coprocessors, or an I/O processor 12, a graphics processor 14, and a sound processor 16. The arithmetic processing apparatus 1000 also includes a plurality of memories to be managed by the respective processors, or namely, a main memory 20, an I/O memory 22, a graphic memory 24, and a sound memory 26. The processors and the memories are connected to each other via a bus 50. The arithmetic processing apparatus 1000 further includes a device controller 30 which controls a DVD drive and the like, and other not-shown processors.

The CPU 10 is a processor which performs general-purpose arithmetic processing. The CPU 10 may include, for example, a plurality of sub processors. The main memory 20 is a memory area to be used and managed primarily by the CPU 10, and is composed of a DRAM or the like. The main memory 20 may be accessed from the other processors 12, 14, and 16, and the like by a direct memory access (DMA) method without the intervention of the CPU 10. The CPU 10 may control access to the main memory 20 from the other processors 12, 14, and 16 using a programmed I/O (PIO) method.

The coprocessors including the I/O processor 12, the graphics processor 14, and the sound processor 16 are application-specific processors which are designed to perform specific processing.

The I/O processor 12 provides input and output interfaces for external devices that are connected outside the arithmetic processing apparatus 1000, and manages data transfer through internal buses. For example, the I/O processor 12 provides data transfer and the like corresponding to USB (Universal Serial Bus), IEEE-1394, and other specifications. The I/O memory 22 is a memory to be used and managed by the I/O processor 12.

The graphics processor 14 is an arithmetic processing unit which performs image processing. For example, the graphics processor 14 performs polygon modeling, shading, rendering, and the like, and outputs still images or moving images to a frame buffer. The graphic memory 24 is a memory area to be used and managed by the graphics processor 14, and includes the frame buffer, a CLUT (Color Look Up Table), and the like. The high-performance graphics processor 14 and the graphic memory 24 may be connected to each other via a high-speed dedicated bus.

The sound processor 16 is a processor which performs sound-related signal processing. The sound memory 26 is a memory to be used and managed by the sound processor 16.

That is, the I/O memory 22, the graphic memory 24, and the sound memory 26 function as application-specific memories to be managed by the plurality of application-specific processors 12, 14, and 16.

In a conventional configuration, the individual processors and memories have typically been formed as separate semiconductor chips, and arranged on printed circuit boards (PCBs). Even when some of the circuit blocks are integrated, the integration has not gone beyond a level such that the graphic memory 24 or the sound memory 26 is built into the graphics processor 14 or the sound processor 16 as an eDRAM. Then, the main processor and the coprocessors have been formed on separate semiconductor substrates.

In contrast, in the arithmetic processing apparatus 1000 according to the present embodiment, the plurality of processors for performing different kinds of processing is integrated on a first semiconductor substrate while the plurality of memories to be managed by the plurality of processors integrated on the first semiconductor is integrated on a second semiconductor substrate. Hereinafter, a description will be given of some of configuration examples thereof.

First Configuration Example

Figure 2:
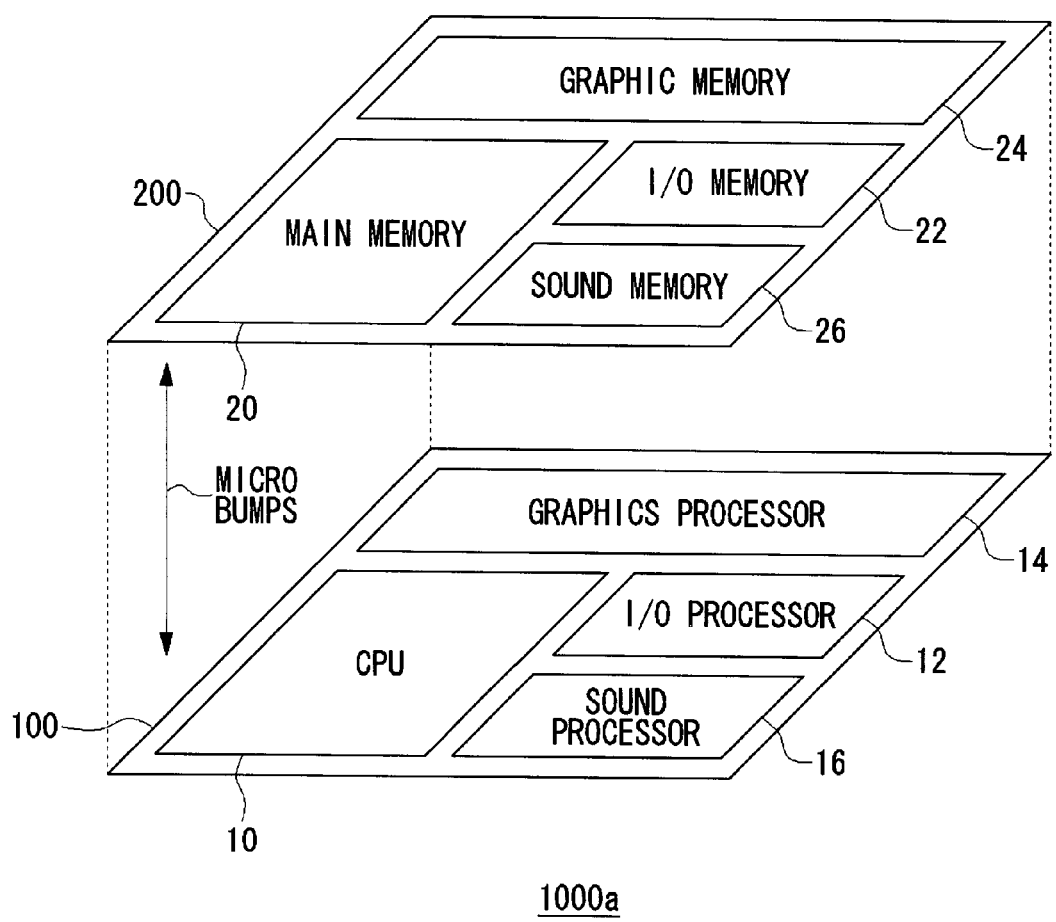
FIG. 2 is a diagram showing the configuration of an arithmetic processing apparatus according to a first configuration example.

In a first configuration example, the CPU 10, the I/O processor 12, the graphics processor 14, and the sound processor 16 are integrated on one semiconductor substrate. The main memory 20, the I/O memory 22, the graphic memory 24, and the sound memory 26 are integrated on another semiconductor substrate. FIG. 2 is a diagram showing the configuration of an arithmetic processing apparatus 1000a according to the first configuration example. The arithmetic processing apparatus 1000a includes a first semiconductor substrate 100 and a second semiconductor substrate 200. The CPU 10, the I/O processor 12, the graphics processor 14, and the sound processor 16 are integrated on the first semiconductor substrate 100. The main memory 20, the I/O memory 22, the graphic memory 24, and the sound memory 26 are integrated on the second semiconductor substrate 200. The device controller 30 and the like may also be integrated on the first semiconductor substrate 100. In fact, the first semiconductor substrate 100 and the second semiconductor substrate 200 shown in FIG. 2 may often be different in area. For simplicity of drawing, however, the two substrates are shown as having similar areas.

The plurality of processors 10, 12, 14, and 16 integrated on the first semiconductor substrate 100 have respective independent memory controllers (not shown) for controlling the memories 20, 22, 24, and 26 to be managed, integrated on the second semiconductor substrate 200. That is, the first semiconductor substrate 100 and the second semiconductor substrate 200 are connected with each other at least through signal lines between the processors and the respective memories. In the example of FIG. 2, the CPU 10 and the main memory 20, the I/O processor 12 and the I/O memory 22, the graphics processor 14 and the graphic memory 24, and the sound processor 16 and the sound memory 26 are connected through at least four systems of signal lines.

In the present embodiment, micro bumps are formed on the surfaces of the first semiconductor substrate 100 and the second semiconductor substrate 200. The first semiconductor substrate 100 and the second semiconductor substrate 200 are then stacked together in the thickness direction so that the processors and the memories are connected through the micro bumps. In this case, the arrangement of the individual blocks integrated on the first semiconductor substrate 100 may be determined in view of such factors as their occupied areas, the amounts of heat generation, and the layout efficiency of the connecting bus 50. The arrangement of the memories integrated on the second semiconductor substrate 200 may be determined depending on the mode of connection with the first semiconductor substrate 100. More specifically, as shown in FIG. 2, the plurality of processors 10, 12, 14, and 16, and the plurality of memories 20, 22, 24, and 26 to be respectively managed are preferably arranged so that their projections overlap each other at least in part. Such an arrangement makes it possible to minimize the length of the wiring that connects the processors and the memories which are laid on the first semiconductor substrate 100 and the second semiconductor substrate 200.

The first semiconductor substrate 100 and the second semiconductor substrate 200 are manufactured by different semiconductor manufacturing processes. For example, the first semiconductor substrate 100 is manufactured by a semiconductor manufacturing process that is optimal for logic formation since the processors are integrated thereon. In the cases of processors for use in high-performance game consoles, such as in the present embodiment, the finest processes available at the time of designing may be used. For example, the first semiconductor substrate 100 is designed to and manufactured by a 90– nm manufacturing process.

The second substrate 200 is designed to and manufactured by a semiconductor manufacturing process that is optimal for DRAM formation. Depending on the capacities of the DRAMs, the most advanced processes may not be needed. In this case, the semiconductor manufacturing process of the second semiconductor substrate 200 may be one of previous generations which have coarser pitches than that of the semiconductor manufacturing process of the first semiconductor substrate 100, such as 0.11 μm and 0.13 μm.

As detailed above, a manufacturing process optimal for designing processors, i.e., designing logic circuits can be selected as the manufacturing process of the first semiconductor substrate, and a manufacturing process optimal for designing memory arrays can be selected as the manufacturing process of the second semiconductor substrate. This can guarantee the effect of improved yield, reduced area of occupation, and any associated cost reduction. Furthermore, even if the semiconductor manufacturing processes of the first semiconductor substrate 100 and the second semiconductor substrate 200 are of the same rule, it is possible to reduce the numbers of masks on the first and second semiconductor substrates 100 and 200 since there is no need to use DRAM merged processes. This allows for cost reduction.

As described above, according to the first configuration example, the processors and the memories are formed separately on the first semiconductor substrate 100 and the second semiconductor substrate 200, respectively. It is therefore possible to select respective optimal semiconductor manufacturing processes. Moreover, the plurality of processors 10, 12, 14, and 16, and the memories 20, 22, 24, and 26 to be managed by the respective processors are connected to each other through micro bumps. This eliminates the need to provide the first semiconductor substrate 100 and the second semiconductor substrate 200 with input and output buffers which have been required heretofore. As a result, it is possible to remove the input and output buffers which have previously functioned as delay elements, thereby improving the throughput in comparison to the throughput available up until now. The micro-bump connection can also reduce delay due to the wiring that has been laid on conventional PCBs. This allows for a further improvement in throughput. The removal of the input and output buffers also reduces the circuit area and thus contributes to cost reduction.

Second Configuration Example

Figure 3:
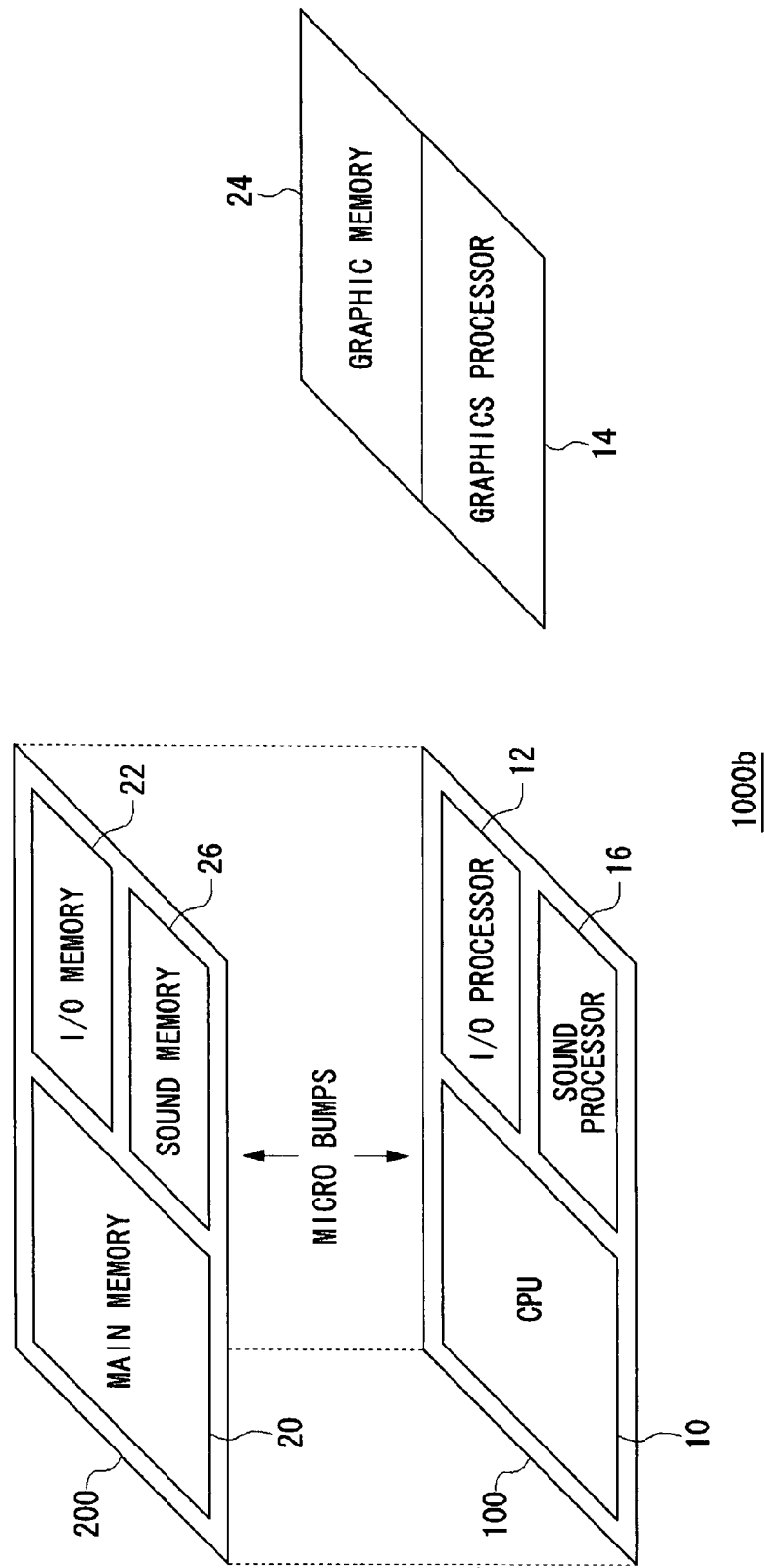
FIG. 3 is a diagram showing the configuration of an arithmetic processing apparatus according to a second configuration example.

FIG. 3 is a diagram showing the configuration of an arithmetic processing apparatus 1000b according to a second configuration example. Hereinafter, a description will be given of the differences between the first configuration example and the second configuration example. In the arithmetic processing apparatus 1000b of FIG. 3, the graphics processor 14 and the graphic memory 24 are not integrated on the first semiconductor substrate 100 and the second semiconductor substrate 200, respectively. That is, what are integrated on the first semiconductor substrate 100 are the CPU 10, and the I/O processor 12 and the sound processor 16 that are the application-specific processors excluding the graphics processor 14 which performs image processing. What are integrated on the second semiconductor substrate 200 are the main memory 20 to be managed by the CPU 10, and the application-specific memories to be managed by the application-specific processors other than the graphics processor 14, i.e., the I/O memory 22 and the sound memory 26 to be managed by the I/O processor 12 and the sound processor 16, respectively.

The graphics processor 14 and the graphic memory 24 are integrated on another semiconductor substrate which lies outside the first semiconductor substrate 100 and the second semiconductor substrate 200. The graphic memory 24 and the graphics processor 14 must be connected to each other with a bandwidth broader than that between the other processors and memories. Thus, the connection between the two sometimes requires a broader bus width. In such cases, it is desirable that the graphics processor 14 and the graphic memory 24 be configured separately from the first semiconductor substrate 100 and the second semiconductor substrate 200 as in the second configuration example.

The graphic memory 24 may be separated from the graphics processor 14. The graphic memory 24 may otherwise be formed as an eDRAM, being integrated on a third semiconductor substrate along with the graphics processor 14.

The first semiconductor substrate 100 and the second semiconductor substrate 200 are connected through micro bumps as in the first configuration example. The graphics processor 14 may be connected to the first semiconductor substrate 100 and the second semiconductor substrate 200 through micro bumps or through a PCB.

Forming the graphics processor 14 on a semiconductor substrate other than the first semiconductor substrate 100 and the second semiconductor substrate 200 as in the second configuration example has the following effects. First, the bus between the CPU 10, the I/O processor 12, and the sound processor 16 which are integrated on the first semiconductor substrate 100 can be built into the semiconductor substrate. This makes stable signal processing possible. Second, the graphics processor 14 and the graphic memory 24 are designed as separate chips outside the first and second semiconductor substrates. This allows for throughput-oriented design. In this case, the semiconductor manufacturing process of the graphics processor 14 may be different from that of the first semiconductor substrate 100. Third, the CPU 10 and the graphics processor 14 can be developed independently of each other. As has been found in recent years, it requires enormous amounts of time and cost to design high-performance processors. Designing the CPU 10 and the graphics processor 14 as separate chips can thus improve the development efficiency.

Third Configuration Example

The first configuration example translates into an example where the first semiconductor substrate 100 and the second semiconductor substrate 200 are configured separately in view of the circuit functions of processors and memories. In the third configuration example, the individual elements of FIG. 1, i.e., the plurality of processors and the plurality of memories to be managed by the plurality of processors are classified depending on the semiconductor manufacturing processes optimal for manufacturing the respective circuit blocks, regardless of the functions thereof. Then, the components classified into an identical semiconductor manufacturing process are formed on the same semiconductor substrate. The "optimal processes" refer to processes that are determined in a comprehensive manner, for example, based on the throughput, cost, power consumption, and the like required of each component.

Following the design concept of the third configuration example may also result in the classifications into processors and into memories as in the first and second configuration examples, while it can possibly produce different results. For example, the CPU 10 and the graphic memory 24 may sometimes require high throughput and low power consumption while the I/O processor 12 and the sound processor 16 do not require so high throughput. In such cases, the CPU 10 and the graphic memory 24 are manufactured and integrated using the most advanced semiconductor manufacturing process while the I/O processor 12 and the sound processor 16 are integrated using a coarser semiconductor manufacturing process.

Moreover, if the cost of the DRAM merged process is reduced in the future, or if new logic or memory devices are developed, it is expected that the logic and the memories may be optimally manufactured using an identical semiconductor manufacturing process. In this case, the logic and the memories shall be formed on the same substrate.

As detailed above, in the third configuration example, the circuit blocks are classified and integrated in view of semiconductor manufacturing processes. This makes it possible to optimize the design of the entire arithmetic processing apparatus.

The present invention has been described in conjunction with the embodiments thereof. It is understood, however, that these embodiments only show the principles and applications of the present invention, and a lot of modifications and layout changes may be made thereto without departing from the concept of the present invention set forth in claims.

For example, the first and second configuration examples have dealt with the cases where the first semiconductor substrate 100 and the second semiconductor substrate 200 are provided with micro bumps, and are stacked together in the direction of thickness of the substrates. This is not intended to be restrictive, however. For example, micro bumps may be formed on the surfaces of the first semiconductor substrate 100 and the second semiconductor substrate 200, and a silicon interposer may be used for connection. Alternatively, the first semiconductor substrate 100 and the second semiconductor substrate 200 may be mounted on a PCB, and connected with each other through signal lines that are laid on the PCB.

In this case, the processors on the first semiconductor substrate 100 and the memories on the second semiconductor substrate 200 are desirably arranged so as to reduce the length of the wiring to connect the processors and the memories, laid on the silicon interposer. In this instance, higher priority may be given to memories that require broader bus widths. In the present embodiment, the graphic memory 24 may be located closest to the graphics processor 14 when the first semiconductor substrate 100 and the second semiconductor substrate 200 are juxtaposed to each other. Then, the main memory 20 may be located close to the CPU 10.

The embodiment has not shown any analog circuit such as an A/D converter and a D/A converter. These circuits may be integrated on a semiconductor substrate other than the first semiconductor substrate 100 and the second semiconductor substrate 200 separately. Since the use of fine processes has only a limited effect on the downsizing of analog circuits, the integration on a substrate different from the first semiconductor substrate 100 and the second semiconductor substrate 200 allows for a reduction in cost.

While the preferred embodiments of the present invention have been described using specific terms, such description is for illustrative purposes only, and it is to be understood that changes and variations may be made without departing from the spirit or scope of the appended claims.

What is claimed is:

1. A processing apparatus comprising:
   a first semiconductor substrate on which a plurality of processors configured to perform different types of processing from one another are formed; and
   a second semiconductor substrate on which a plurality of memories are formed, each of the memories coupled to a respective one of the plurality of processors; and
   micro bumps formed on the surfaces of the first and second semiconductor substrates,
   wherein the plurality of processors includes respective separate memory controllers coupled to the memories,
   wherein the first and second semiconductor substrates are stacked together in a thickness direction, and coupled to each other through the micro bumps,
   wherein the second semiconductor substrate is a substrate manufactured by a semiconductor process having a coarser pitch than the pitch of the first semiconductor substrate.

2. The processing apparatus according to claim 1, wherein the plurality of processors and the respective plurality of memories are arranged so that the respective micro bumps thereof at least partially overlap each other.

3. A processing apparatus comprising:
   an arithmetic processor configured to perform general-purpose processing;
   a memory coupled to the arithmetic processor;
   a plurality of application-specific processors configured to perform application-specific types of processing;
   an image processor configured to perform processing of images;
   an image memory coupled to the image processor; and
   application-specific memories coupled to the plurality of application-specific processors,
   wherein the arithmetic processor and the application-specific processors excluding the image processor are formed on a first semiconductor substrate, and
   wherein the memory coupled to the arithmetic processor and the application-specific memories coupled to the respective application-specific processors excluding the image processor are formed on a second semiconductor substrate.

4. The processing apparatus according to claim 3, wherein the image processor and the image memory are formed on a third semiconductor substrate.

5. The processing apparatus according to claim 3, wherein the second semiconductor substrate is a substrate manufactured by a semiconductor process having a coarser pitch than the pitch of the first semiconductor substrate.

* * * * *